(12) United States Patent
Anderson et al.

(10) Patent No.: US 7,230,287 B2
(45) Date of Patent: Jun. 12, 2007

(54) CHEVRON CMOS TRIGATE STRUCTURE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,623

(22) Filed: Aug. 10, 2005

(65) Prior Publication Data

US 2007/0034971 A1 Feb. 15, 2007

(51) Int. Cl.
*H01L 29/76* (2006.01)
(52) U.S. Cl. ............... 257/213; 257/308; 257/722; 257/E21.014
(58) Field of Classification Search .............. None
See application file for complete search history.

(56) References Cited

U.S. PATENT DOCUMENTS

| | | | |
|---|---|---|---|
| 6,475,869 B1 * | 11/2002 | Yu | 438/303 |
| 6,794,718 B2 * | 9/2004 | Nowak et al. | 257/347 |
| 2004/0038464 A1 | 2/2004 | Fried et al. | |
| 2004/0108559 A1 | 6/2004 | Sugii et al. | |
| 2004/0195624 A1 | 10/2004 | Liu et al. | |
| 2004/0217433 A1 | 11/2004 | Yeo et al. | |

OTHER PUBLICATIONS

Breed, et al., "Dual-Gate (FinFET) and Tri-Gate MOSFETs: Simulation and Design," Semiconductor Device Research Symposium, 2003 International, Dec. 10-12, 2003, pp. 150-151.
Doyle, et al., "Tri-Gate Fully-Depleted CMOS Transistors: Fabrication, Design & Layout," 2003 Symposium on VLSI Technology Digest of Technical Papers, Jun. 10-12, 2003, pp. 133-134.
Stadele et al., "A Comprehensive Study of Corner Effects in Tri-Gate Transistors," Solid-State Device Research Conference 2004, ESSDERC 2004, Sep. 21-23, 2004, pp. 165-168.

* cited by examiner

*Primary Examiner*—Leonardo Andujar
*Assistant Examiner*—Scott R. Wilson
(74) *Attorney, Agent, or Firm*—Gibb & Rahman, LLC; William D. Sabo, Esq.

(57) ABSTRACT

Disclosed herein is a structure with two different type tri-gate MOSFETs formed on the same substrate. Each MOSFET comprises a fin with optimal mobility for the particular type of MOSFET. Due to the processes used to form fins with different crystalline orientations on the same substrate, one of the MOSFETs has a fin with a lower mobility top surface. To inhibit inversion of the top surface, this MOSFET has a gate dielectric layer with a thicker region on the top surface than it does on the opposing sidewall surfaces. Additionally, several techniques for forming the thicker region of the gate dielectric layer are also disclosed.

18 Claims, 11 Drawing Sheets

CHEVRON CMOS TRIGATE STRUCTURE

BACKGROUND OF THE INVENTION

1. Field of the Invention

The present invention relates generally to the field of semiconductor CMOS technology and, more particularly, to high mobility crystalline planes in tri-gate FinFET CMOS technology.

2. Description of the Related Art

The mobility rates of holes and electrons through a p-channel and an n-channel of a p-type field effect transistor (p-FETs) and an n-type field effect transistor (n-FETs), respectively, effects delay. These mobility rates can be a function of the crystalline orientation of the semiconductor used to form the channel region. For example, delay can be minimized in a p-FET by forming the p-channel in a semiconductor having a 110 crystalline orientation which has the highest mobility for holes. Delay can be minimized in an n-FET by forming the channel in a semiconductor having a 100 crystalline orientation which has the highest mobility for electrons. Recent developments in FET technology allow semiconductor planes (e.g., fins) with different crystalline orientations to be formed on the same substrate so that each plane has an optimal mobility for incorporation into a particular type FET (e.g., an n-FET or a p-FET).

U.S. Pat. No. 6,794,718 issued to Nowak et al. on Sep. 21, 2004 and incorporated herein by reference discloses a CMOS structure in which an n-FET and a p-FET are formed on the same substrate. In particular, the structure comprises a double-gated n-FET (e.g., a finFET) having an n-channel in a semiconductor fin with a 100 orientation and double-gated p-FET having a p-channel in a semiconductor fin with a 110 orientation. The two semiconductor fins are formed on the same substrate and positioned with a non-orthogonal, non-parallel orientation with respect to one another (i.e., a chevron structure). However, the method used to form the fins can result in one of the fins having a top surface with a different crystalline orientation. For example, either the fin with the 100 orientation will with have a top surface with a 110 orientation or the fin with the 110 orientation will have a top surface with a 100 orientation. The wafer used to make the fin structure will determine which fin has the top surface with the different orientation.

While a fin having a top surface with a different orientation may be satisfactory for use in a double-gated FET (i.e., a finFET), this differing top surface orientation can affect the performance of a tri-gate MOSFET. Specifically, tri-gate MOSFETs have a similar structure to that of a finFET; however, the fin width and height are approximately the same so that the gate is present on three sides of the fins, including the top surface of the fin and the opposing sidewalls. For a detail discussion of the structural differences between dual-gate finFETs and tri-gate MOSFETs see "Dual-gate (finFET) and Tri-Gate MOSFETs: Simulation and Design" by A Breed and K. P. Roenker, Semiconductor Device Research Symposium, 2003, pages 150–151, December 2003 (incorporated herein by reference). Due to the lower mobility top surface, inversion can occur at the top surface of the fin in the channel region and can cause delay in a tri-gate MOSFET.

SUMMARY OF THE INVENTION

The disclosure presents an improved structure for a chevron tri-gate MOSFET and a method of forming the structure. Generally, the structure comprises two different type chevron tri-gate MOSFETs (e.g., an n-FET and a p-FET) formed on the same substrate. Each MOSFET has a channel region in a semiconductor fin. The semiconductor fins have a non-orthogonal, non-parallel orientation with respect to each other and, thus, each semiconductor fin has essentially a different crystalline orientation. The different crystalline orientations ensure optimal mobility through the channel regions of the different type MOSFETs. However, due to the formation process a top surface of one of the semiconductor fins has the same crystalline orientation as the other semiconductor fin. This differing top surface orientation provides lower mobility and can cause inversion and, thereby, cause delay in the corresponding MOSFET. One improvement disclosed herein is the incorporation of a gate dielectric layer on the offending fin that is thicker on the top surface of the fin than it is on the sidewalls of the fin. The thickness of the gate dielectric layer on the top surface is predetermined in order to optimally inhibit inversion, to selectively adjust the threshold voltage of the corresponding MOSFET, to selectively tune the drive current of the corresponding MOSFET, and to, thereby, reduce delay.

More particularly, one aspect of the structure of the invention comprises a first-type field effect transistor (FET) on a substrate. The first-type FET comprises a first semiconductor fin. The first semiconductor fin has a top surface and opposing sidewall surfaces. The fin height can range from approximately one-half to two times a width of said fin. The opposing sidewall surfaces of have a first crystalline orientation and the top surface has a second crystalline orientation. A gate dielectric layer is positioned adjacent the top surface and sidewall surfaces of the first semiconductor fin. A first region of the gate dielectric layer is positioned adjacent the top surface of the first semiconductor fin. A second region of the gate dielectric layer is positioned adjacent the opposing sidewall surfaces of the fin. A first thickness of the first region of the gate dielectric layer is different than a second thickness of the second region of the gate dielectric layer. The first thickness is greater than the second thickness and can be predetermined in order to inhibit inversion of the top surface, to selectively adjust a threshold voltage of the first field effect transistor, and to selectively tune a drive current the first-type field effect transistor. Additionally, the structure of the invention can comprise a second-type field effect transistor adjacent the first-type field effect transistor on the same substrate. The second-type field effect transistor comprises a second semiconductor fin. This second semiconductor fin has a non-orthogonal, non-parallel orientation on the substrate with respect to the first semiconductor fin. The second semiconductor fin further has only one crystalline orientation. The crystalline orientation of the second semiconductor fin is different from that of the opposing sidewall surfaces of the first semiconductor fin, but the same as that of the top surface of the first semiconductor fin. Lastly, a second gate dielectric layer can be positioned adjacent to the top surface and opposing sidewall surfaces of the second semiconductor fin and gate electrodes can further be positioned on the respective gate dielectric layers adjacent to the channel regions of each semiconductor fin.

An embodiment of the method of forming a semiconductor structure with a first-type field effect transistor adjacent a second-type field effect transistor on the same substrate comprises first simultaneously forming a first semiconductor fin and a second semiconductor fin on the substrate. This method starts with providing or forming a wafer comprising an isolation layer (e.g., a oxide layer or a doped Si or SiGe layer), a semiconductor layer on the isolation layer and an oxide layer (e.g., a silicon dioxide hard mask) on the semiconductor layer. The wafer may also comprise another semiconductor layer below the isolation layer (e.g., below a buried oxide layer). A photoresist is deposited onto the oxide layer and lithographically patterned with the first and second semiconductor fins. The pattern is such that the fins will have a non-orthogonal, non-parallel orientation on the substrate with respect to each other. The wafer is then etched through the oxide layer, through the semiconductor layer, and to the isolation layer to form the first and second semiconductor fins. Once the fins are etched, the photo-resist is removed. The fins are formed so that their height ranges from approximately one-half to two times their width. Thus, the fins can be used to form tri-gate MOSFET devices as opposed to finFETs.

Due to the relative positioning of the fins, as the fins are etched the first semiconductor fin is formed with opposing sidewall surfaces having a first crystalline orientation and a top surface having a second crystalline orientation. This second crystalline orientation has a lesser mobility for the first-type field effect transistor than the first crystalline orientation. Additionally, the second semiconductor fin is formed with only the second crystalline orientation (i.e., the same orientation as top surface of the first semiconductor fin). Upon completing the first and second semiconductor fins, gate dielectric layers are formed on both semiconductor fins. However, with respect to the first semiconductor fin that has the lower mobility crystalline orientation at its top surface, the gate dielectric layer is formed with a first region on the top surface that has a thickness that is different from the second thickness of the gate dielectric layer formed on the opposing sidewalls (i.e., the second region of the gate dielectric layer). In order to inhibit inversion of the top surface of the first semiconductor fin caused by the lower mobility, the first thickness can be predetermined. Similarly, in order to selectively adjust a threshold voltage of the first-type field effect transistor or to selectively tune the drive current of the first-type field effect transistor, the first thickness can be predetermined.

More particularly, the first region of the gate dielectric layer of the first semiconductor fin can be formed with a first thickness that is different from the second thickness of the second region using several different techniques. In one technique, the first region of the gate dielectric layer is formed as the first semiconductor fin is formed. More particularly, after the fins are etched and the photoresist is removed, the first semiconductor fin is masked. Then, a remaining portion of the second oxide layer is removed from the second semiconductor fin and the mask is removed from the second semiconductor fin. Another remaining portion of the second oxide layer that is positioned above the top surface of the first semiconductor fin forms the first thicker region of the gate dielectric layer on the first semiconductor fin. Optionally, at this point in the technique a hydrogen smoothing anneal can be conducted. The hydrogen smoothing anneal can be followed by growing a sacrificial oxide on surfaces of each of the semiconductor fins. The sacrificial oxide is stripped from the fins in order to remove any irregularities. The second region of the gate dielectric layer is then formed on the opposing sidewalls of the first semiconductor fin by either growing another oxide layer or by depositing another dielectric layer (e.g., a high-k dielectric layer). This process simultaneously forms the gate dielectric layer for the second semiconductor fin.

An alternate technique for forming the gate dielectric layer on the first semiconductor fin similarly starts with etching the first and second semiconductor fins into the wafer. However, with this technique after etching the fins, both the photoresist and the hard mask are removed from both the first and the second semiconductor fins. Optionally, at this point in the technique a hydrogen smoothing anneal can be conducted. The second semiconductor fin is then masked and an ion implantation process is performed on the top surface of the first semiconductor fin. Ions, such as silicon, xenon, argon, etc., implanted into the top surface of the first semiconductor damage the top surface and, thereby, increase the rate at which an oxide can be grown on the surface of the fin. Once the ion implantation process is completed, the mask is removed from the second fin and again, a optional hydrogen smoothing anneal may be performed. Then, a sacrificial oxide layer is the grown on the top surface and opposing sidewalls of both the first and second semiconductor fins. However, due to the ion implantation process, the sacrificial oxide grows at a faster rate on the top surface of the first semiconductor fins than it does on the opposing sidewalls of the first semiconductor fin or on any of the surfaces of the second semiconductor fin. The sacrificial oxide layer is then stripped to remove irregularities. However, this sacrificial oxide is completely stripped only from the second semiconductor fin and from the opposing sidewalls of the first semiconductor fin. Because the sacrificial oxide layer is thicker on the top surface of the first semiconductor fin, a portion of the sacrificial oxide layer will remain after the stripping process. This remaining portion of the sacrificial oxide layer provides the greater thickness of the first region of the gate dielectric layer on the top surface of the first semiconductor fin. The second region of the gate dielectric layer of the first semiconductor fin is then formed on the opposing sidewalls of the first semiconductor fin by either growing another oxide layer or by depositing another dielectric layer (e.g., a high-k dielectric layer). This process simultaneously forms the gate dielectric layer for the second semiconductor fin.

Once the gate dielectric layers are formed on the semiconductor fins, the transistor formation process can be completed for each of the different type tri-gate MOSFETs. Additional processing may include depositing, patterning and etching gate conductors, forming source/drain extensions, forming halos, forming spacers, forming source/drain regions, and depositing and planarizing an additional dielectric layer. These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED

Embodiments of the Invention

Figure 1:
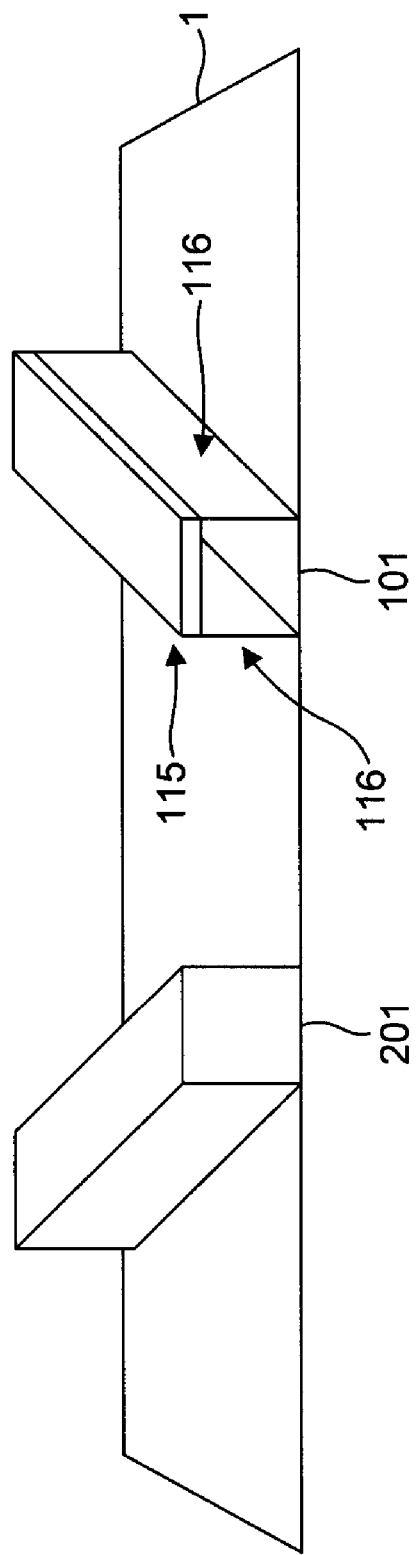
FIG. 1 is a schematic perspective illustration of a semiconductor structure.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 2:
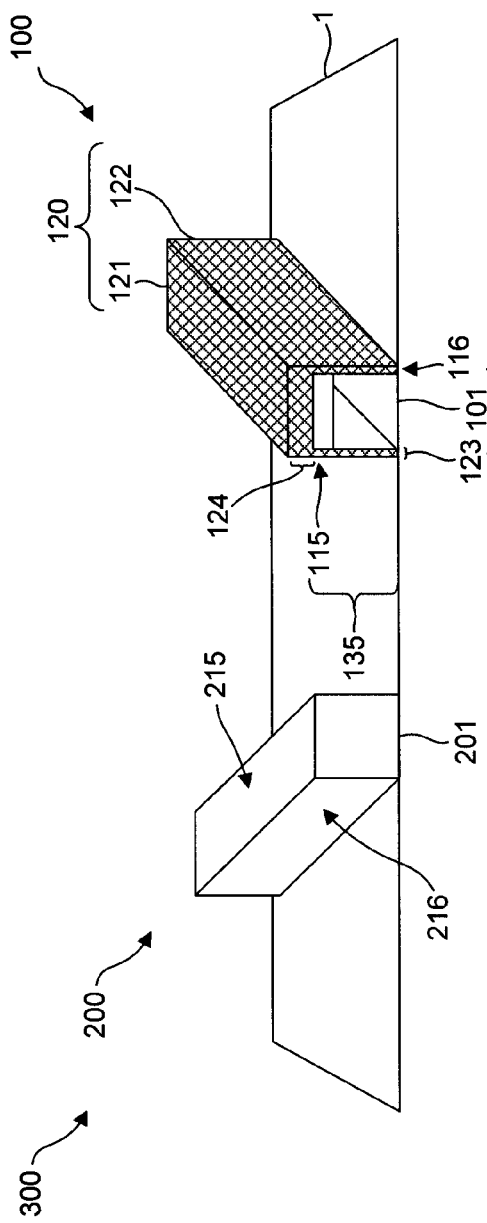
FIG. 2 is a schematic perspective illustration of an embodiment of the structure of the invention.

As discussed above, prior art methods of forming fins (i.e., semiconductor planes) having different crystalline orientations (e.g., {100}, {111}, {110}, {211}, {311}, {511} and {711}) on the same substrate often result in one of the fins having a top surface with a different orientation than that of the surfaces of the opposing sidewalls of the fin. Referring to FIG. 1, a first semiconductor fin 101 and a second semiconductor fin 201 are positioned on a substrate 1 and have a non-orthogonal, non-parallel orientation with respect to each other. The first semiconductor fin 101 can be used to form a first-type FET 100 (see FIGS. 2–3) and the second semiconductor fin 201 can be used to form a second-type FET 200 (see FIGS. 2–3). The different crystalline orientations ensure optimal mobility through the channel regions of the different type MOSFETs (e.g., optimal hole mobility for a p-FET is achieved with {110} and optimal electron mobility for an n-FET is achieved {100}). However, due to the processing methods used to form the first and second semiconductor fins 101, 201 on the same substrate 1, one of the two fins 101, 201 can have a top surface with a different, lower mobility, crystalline orientation. For example, the first semiconductor fin 101 can have opposing sidewall surfaces 116 with a first orientation (e.g., {100} which is optimal for the channel region of an n-FET) and a top surface 115 of the fin 101 having a second orientation (e.g., a {110}). The second semiconductor fin 201 is formed entirely with the second crystalline orientation (e.g., {110} which is optimal for the channel region of a p-FET). Alternatively, the first semiconductor fin 101 can have opposing sidewall surfaces 116 with a first orientation (e.g., {110}) and a top surface 115 with a second orientation (e.g., {100}), while the second semiconductor fin 201 is formed entirely with the second crystalline orientation (e.g., {100}). A first fin 101 having an top surface 115 with a different orientation may be satisfactory for use in a double-gated finFET in which gates are formed on the sidewalls of the channel region of the fin. However, this differing top surface orientation can affect the performance of a structure that has a gate on a top surface of the channel region of the fin (e.g., a tri-gated MOSFET). For example, a tri-gate p-FET will suffer from a {100} top surface 115 on a {110} channel region and similarly, a tri-gate n-FET will suffer from a {110} top surface 115 of a {100} channel region. Specifically, inversion will occur at the top surface 115 of the first fin 101 if positioned adjacent to a tri-gate structure. This inversion lowers mobility and, thereby, increases delay. Referring to the perspective view illustration of FIG. 2 and the side view illustration of FIG. 3 in combination, the semiconductor structure 300 of the invention addresses this issue by incorporating into a tri-gate MOSFET 100 a gate dielectric layer 120 with a first region 121 on the top surface 115 of the first semiconductor fin 101 and a second region 122 on the opposing sidewalls 116 of the first semiconductor fin 101. The first region 121 has a first thickness 124 that is different from a second thickness 123 of the second region 122. This first thickness 124 of the first region 121 of the gate dielectric layer 120 can be predetermined in order to selectively raise threshold voltage, to decrease capacitance, and to tune (i.e., adjust) drive current, and thereby, to minimize delay of the tri-gate MOSFET structure 100.

More particularly, referring to again to FIGS. 2 and 3 in combination, the semiconductor structure 300 of one embodiment of the invention comprises a first-type field effect transistor (FET) 100 on a substrate 1 adjacent to a second-type field effect transistor 200 (e.g., of the FETs 100, 200 can comprises an n-FET and the other can comprise a p-FET). The first-type FET 100 comprises a first semiconductor fin 101. The first semiconductor fin 101 has a top surface 115 and opposing sidewall surfaces 116 and its height 135 ranges from approximately one-half to two times its width 136. The opposing sidewall surfaces 116 of the first semiconductor fin 101 have a first crystalline orientation and the top surface 115 has a second crystalline orientation. A gate dielectric layer 120 is positioned adjacent the top surface 115 and opposing sidewalls 116 of the first semiconductor fin 101. A first region 121 of the gate dielectric layer 120 is positioned adjacent the top surface 115 of the first semiconductor fin 101. A second region 122 of the gate dielectric layer 120 is positioned adjacent the opposing sidewalls 116 of the fin 101. A first thickness 124 of the first region 121 of the gate dielectric layer 120 is different than a second thickness 123 of the second region 122 of the gate dielectric layer 120. Specifically, the first thickness 124 can be greater than the second thickness 123 and can be predetermined in order to inhibit inversion of the top surface, to selectively adjust a threshold voltage of the first field effect transistor, and to selectively tune (i.e., adjust) a drive current the first-type field effect transistor.

For example, for gate-loaded circuits, the first region 121 of the gate dielectric layer having a thickness greater than that of the second region 122 on the sidewalls inhibits inversion of the lower-mobility top surface 115. This top surface 115, if fully inverted, would add the same inversion load per unit area as the high-mobility surfaces at the sidewalls 116, but would have an approximately 30–50% lower effective drive current, and hence would increase circuit delay. The inventive thick first region 121 of the dielectric layer 120 prevents degradation to the delay by inhibiting inversion and avoiding this extra capacitive loading. Additionally, for current-ratio-sensitive circuits, such as latches or analog-like circuits, the thick first region 121 of the gate dielectric layer 120 can be selectively left or removed on either high-mobility surfaces (e.g., as on the second semiconductor fin 201) or low-mobility surfaces (e.g., as on the first semiconductor fin 101) to further tune the drive strengths of the FETs 100 and 200 for optimum functionality. However, it should be noted that for non-gate-loaded circuits (e.g., typically wire-loaded circuits), the gate capacitance is a small fraction of the total load capacitance, and thus it is advantageous to use the thin oxide on the low-mobility surfaces (e.g., of the first semiconductor fin 101) as well as the high-mobility surfaces (e.g., of the second semiconductor fin 201).

Figure 16:
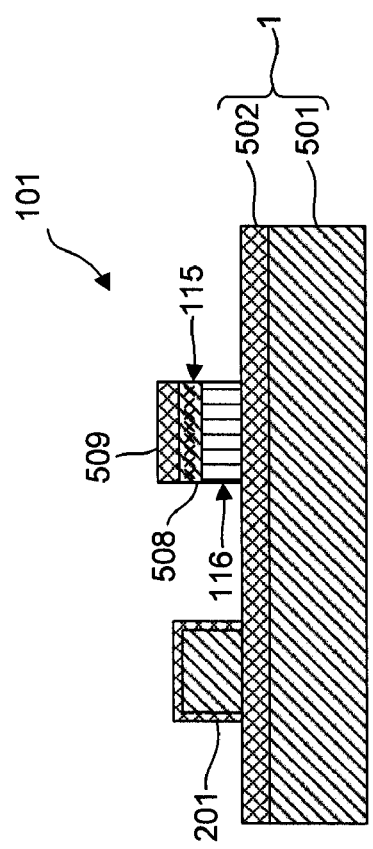
FIG. 16 is a schematic illustration of a partially completed structure of the invention.

Additionally, the structure 300 of the invention can comprise a second-type field effect transistor 200 (e.g., a second type tri-gate MOSFET) adjacent to the first-type field effect transistor 101 on the same substrate 1. The second-type field effect transistor 200 comprises a second semiconductor fin 201. The second semiconductor fin 201 similarly has a top surface and opposing sidewalls and its height ranges from approximately one-half to two times its width. This second semiconductor fin 201 has a non-orthogonal, non-parallel orientation on the substrate 1 with respect to the first semiconductor fin 101. The second semiconductor fin 201 further has only one crystalline orientation. The crystalline orientation of the second semiconductor fin 201 is different from that of the sidewall surfaces 116 of the first semiconductor fin 101, but the same as that of the top surface 115 of the first semiconductor fin 101. Lastly, a second gate dielectric layer 220 can be positioned adjacent to the top surface and sidewalls of the second semiconductor fin 201. The second gate dielectric layer 220 can have the same thickness 223 on both the top surface 215 and the sidewalls 216 of the second semiconductor fin 201 in order to drive a large load capacitance. The thickness 223 of the second gate dielectric layer 220 is also generally the same as the thickness 123 of the second region 122 of the first gate dielectric layer 120 on the first semiconductor fin 101. As discussed above, with regard to current-ratio-sensitive circuits the thickness of the gate dielectric layer on the top surface of the second semiconductor surface may also be varied relative to its thickness on the sidewalls. Varying this thickness, in a manner similar to that described below for the gate dielectric layer 120 of the first-type field effect transistor 100 can further tune the drive strength of the FET 200 for optimum functionality. Lastly, referring to FIG. 16, structure 300 may further comprises other features necessary to complete the FETs 100, 200, including but not limited to gate electrodes 130, 230 adjacent the channel regions 111, 211 of each fin 101, 201, an additional dielectric layer 2, gate contacts 131, 231, source/drain 140a–b, 240a–b contacts 141a–b, 241a–b, etc.

Figure 4:
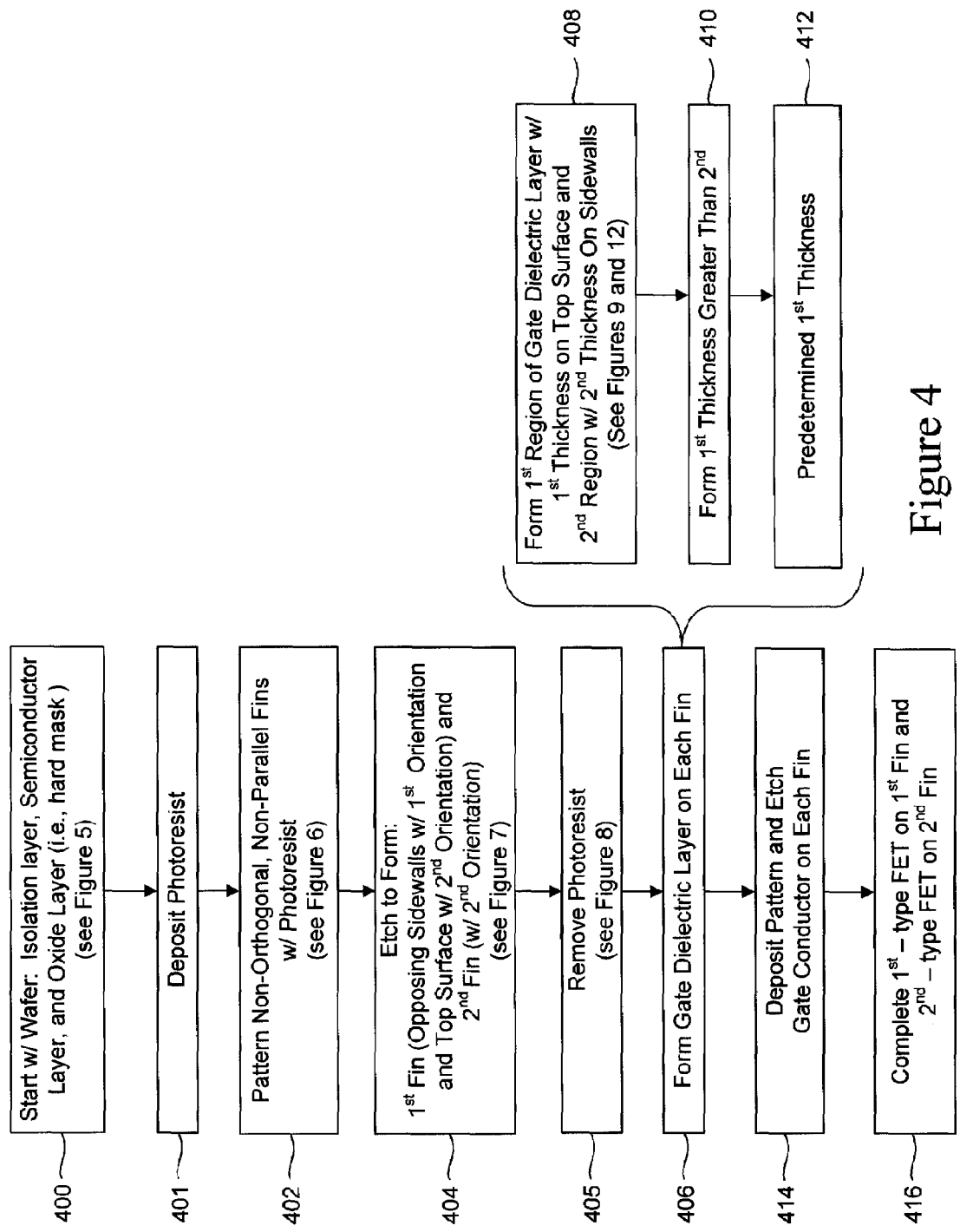
FIG. 4 is a schematic flow diagram of an embodiment of the method of the invention.
Figure 5:
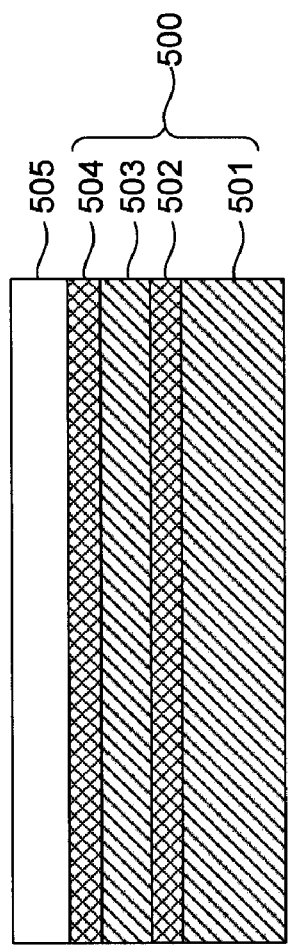
FIG. 5 is a schematic illustration of a partially completed structure of the invention.
Figure 6:
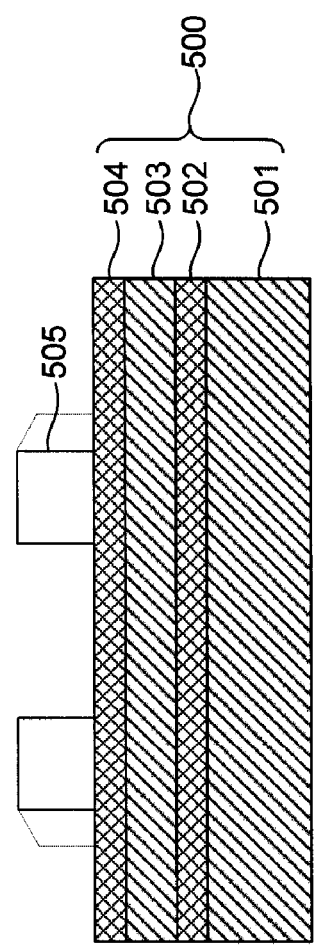
FIG. 6 is a schematic illustration of a partially completed structure of the invention.
Figure 7:
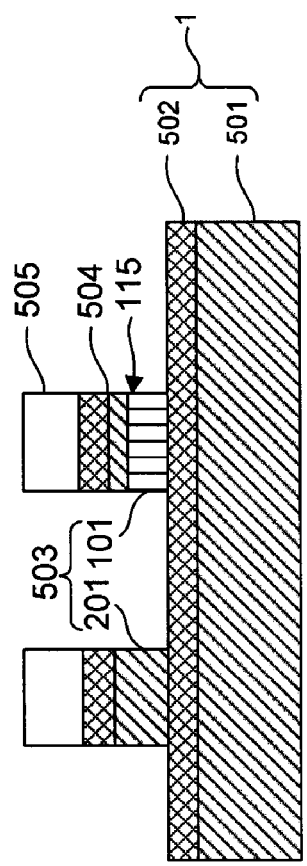
FIG. 7 is a schematic illustration of a partially completed structure of the invention.
Figure 8:
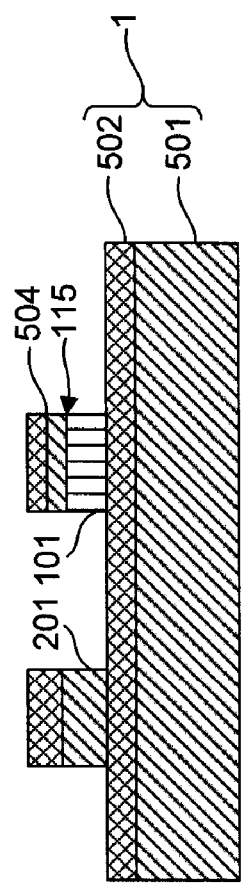
FIG. 8 is a schematic illustration of a partially completed structure of the invention.

Referring to FIG. 4, an embodiment of the method of forming a semiconductor structure 300 with a first-type field effect transistor 100 adjacent a second-type field effect transistor 100 on the same substrate 1 comprises first simultaneously forming a first semiconductor fin 101 and a second semiconductor fin 201 on the substrate 1. This is accomplished by either providing or forming a wafer 500 comprising an isolation layer 502 (e.g., an oxide layer or a doped semiconductor (e.g., Si or SiGe) layer), a semiconductor layer 503 on the isolation layer 502 and an oxide layer 504 (e.g., a silicon dioxide hard mask) on the semiconductor layer 403 (400, see FIG. 5). The wafer 500 may also comprise another semiconductor layer 501 below the isolation layer 502. A photoresist layer 505 is deposited onto the oxide layer 504 (401, see FIG. 5) and lithographically patterned for the first 101 and second 201 semiconductor fins (402, see FIG. 6). The pattern is such that the fins will have a non-orthogonal, non-parallel orientation on the substrate with respect to each other. The wafer 500 is then etched through the oxide layer 504, through the semiconductor layer 503, and to the isolation layer 502 to form the first 101 and second 201 semiconductor fins on a substrate 1 (i.e., on the isolation layer 502 and other semiconductor layer 501) (404, see FIG. 7). The fins 101, 201 are formed so that their height ranges from approximately one-half to two times their width. Thus, the fins 101, 201 can be used to form tri-gate MOSFET devices, discussed above, as opposed to finFETs. More particularly, as a result of the process step 404 the first semiconductor layer 101 is formed with a opposing sidewall surfaces 116 having a first crystalline orientation and with a top surface 115, having a second crystalline orientation. The second crystalline orientation has a lesser mobility for the first-type field effect transistor 100 than the first crystalline orientation. Additionally, as a result of the process step 404 the second semiconductor fin 201 is formed with the second crystalline orientation (i.e., the same orientation as the top surface of the first semiconductor fin). Upon completing the first and second semiconductor fins, the photoresist layer 505 is removed from the top of both fins (405, see FIG. 8) and gate dielectric layers 120, 220 are formed on both the fins (406). However, with respect to the first semiconductor fin 101 that has the lower mobility crystalline orientation at its top surface 115, the gate dielectric layer 120 is formed with a first region 121 on the top surface 115 of the fin 101 and a second region 122 on the opposing sidewalls 116 of the fin 101. Furthermore, the first region 121 has a first thickness 121 that is different from a second thickness 123 of the second region 122 (408). For example, the first region 121 can be formed thicker than the second region 122 (410). In order to inhibit inversion of the top surface 115 of the first semiconductor fin 101 caused by the lower mobility, the first thickness can be predetermined (412). Similarly, in order to selectively adjust a threshold voltage of the first-type field effect transistor or to selectively tune (i.e., adjust) the drive current of the first-type field effect transistor, the first thickness can be predetermined (412).

Figure 9:
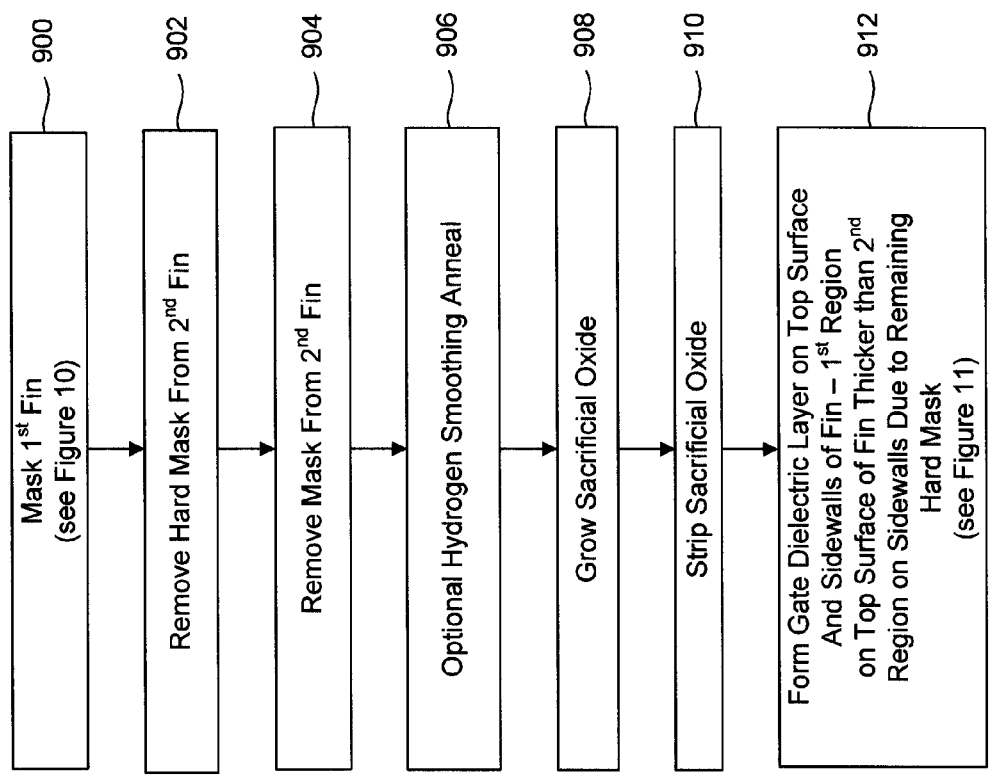
FIG. 9 is a schematic flow diagram illustrating one technique for process 408 of FIG. 4.
Figure 10:
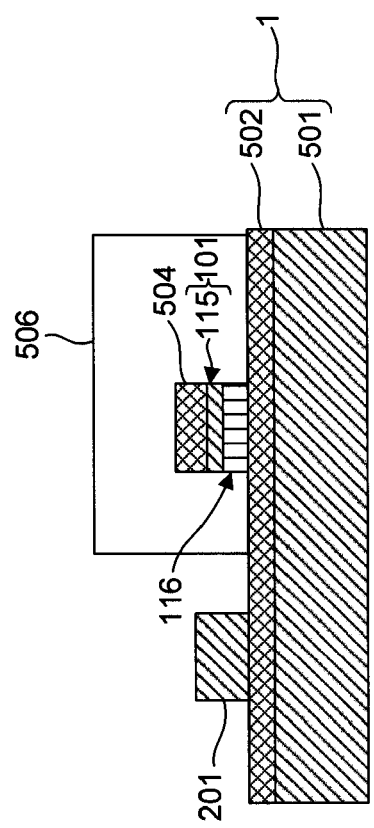
FIG. 10 is a schematic illustration of a partially completed structure of the invention.
Figure 11:
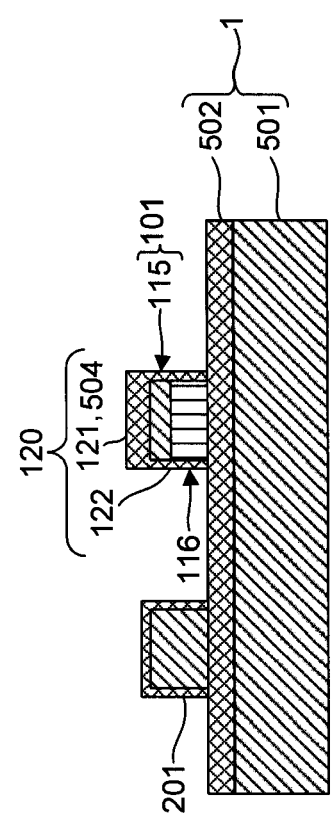
FIG. 11 is a schematic illustration of a partially completed structure of the invention.
Figure 12:
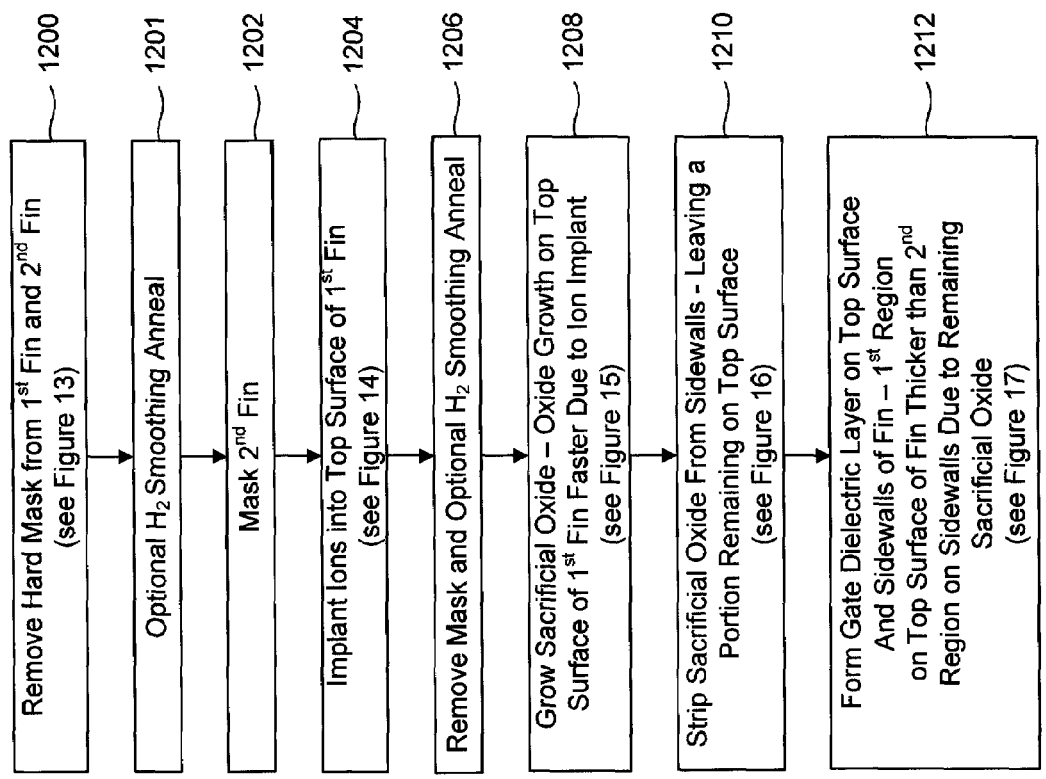
FIG. 12 is a schematic flow diagram illustrating another technique for process 408 of FIG. 4.

More particularly, the first region 121 of the gate dielectric layer 120 of the first semiconductor fin 101 can be formed with a first thickness 124 that is different from the second thickness 123 of the second region 122 at process 408 using several different techniques. Referring to FIG. 9, in one technique, the first region 121 of the gate dielectric layer 120 is formed as the first semiconductor fin 101 is formed. As discussed above, the fins 101, 201 are etched at process 404 and the photo-resist 505 is removed at process 405. Then, a first semiconductor fin 101 is masked (900) and a remaining portion of the second oxide layer 504 is removed from the second semiconductor fin 201 (902, see item 506 of FIG. 10). Specifically, the hard mask 504 is removed from the fin 201 with the high mobility top surface. After the hard mask 504 is removed, the mask 506 is removed from the first semiconductor fin 101 (904, see FIG. 11). Thus, another remaining portion of the second oxide layer 504 is left on the first semiconductor fin 101 above the top surface 115. This remaining portion of the oxide layer 504 (i.e., the hard mask) forms the first region 121 (i.e., thicker region) of the gate dielectric layer 120 on the first semiconductor fin 101. Optionally, at this point in the technique a hydrogen smoothing anneal can be conducted (e.g., at approximately 400° C.) (906). The hydrogen smoothing anneal can be followed by growing a sacrificial oxide on surfaces of each of the semiconductor fins (908). The sacrificial oxide is stripped from the fins in order to remove any irregularities (e.g., using hydrofluoric acid, buffered hydrofluoric acid, or another similar selective etch), but a portion of the hard mask 504 will remain on the top surface 115 (910). The second region 122 of the gate dielectric layer 120 is then formed on the opposing sidewalls 116 of the first semiconductor fin 101 by either growing another oxide layer (e.g., by performing an oxidation and nitridation of the exposed silicon surfaces to form a nitrided silicon dioxide gate dielectric layer) or by depositing another dielectric layer (e.g., a high-k dielectric layer) (912). This process 912 simultaneously forms the gate dielectric layer 220 for the second semiconductor fin 201.

Figure 13:
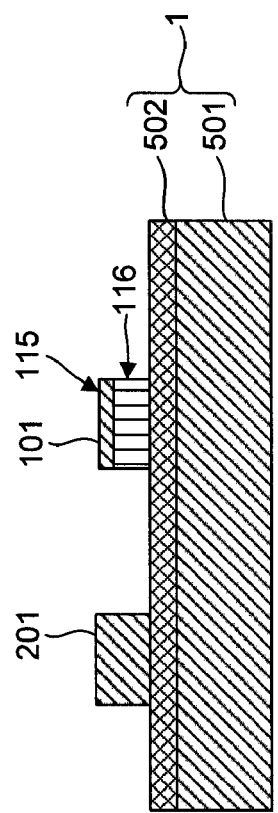
FIG. 13 is a schematic illustration of a partially completed structure of the invention.
Figure 14:
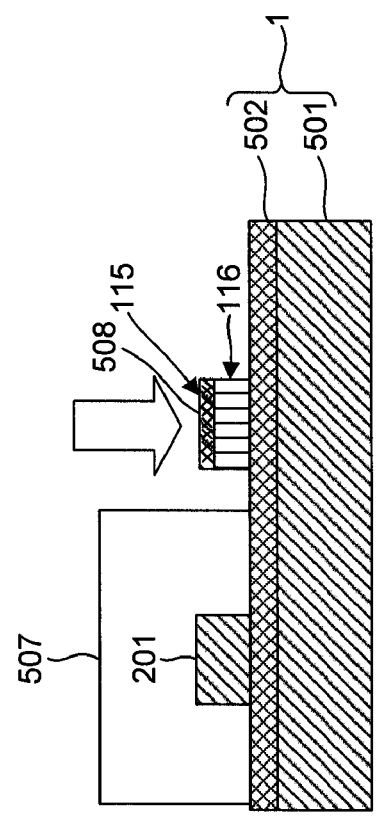
FIG. 14 is a schematic illustration of a partially completed structure of the invention.
Figure 15:
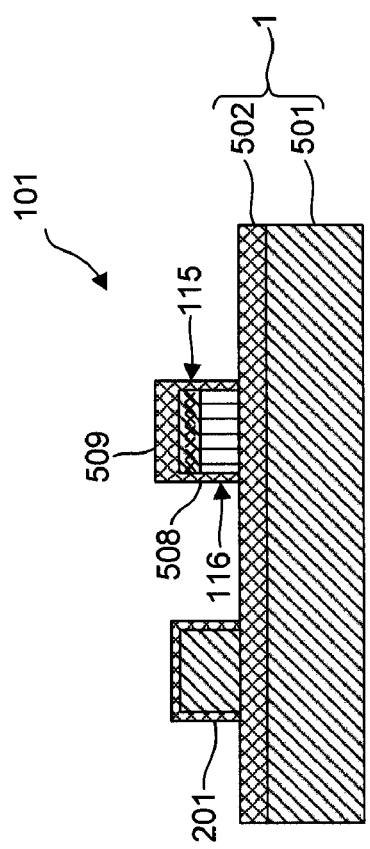
FIG. 15 is a schematic illustration of a partially completed structure of the invention.
Figure 17:
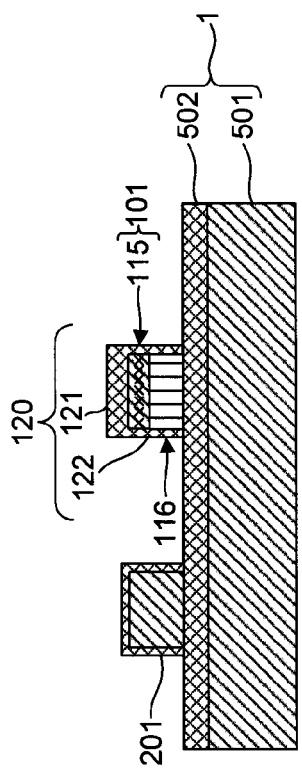
FIG. 17 is a schematic illustration of a partially completed structure of the invention.

Using an alternate technique for forming the gate dielectric layer 120 on the first semiconductor fin 201, after etching the fins 101 and 201 at process 404, the photoresist is removed from fins 101, 202 at process 405 and the hard mask 504 is also removed from fins 101, 201 (1200, see FIG. 13). Optionally, a hydrogen smoothing anneal may be performed (e.g., at approximately 400° C.) (1201). After removing the hard mask 504 (at process 1200), a mask 507 is deposited on the second fin 201 (1202) and an ion implantation process is performed on the top surface 115 of the first semiconductor fin 101 (1204, see FIG. 14). Ions 508, such as silicon, xenon, argon, etc., implanted into the top surface 115 of the first semiconductor fin 101 damage the top surface 115 and, thereby, increase the rate at which an oxide can be grown on the surface 115 of the fin 101. Once the ion implantation process 1204 is completed, the mask 507 is removed from the second fin 201 and an optional hydrogen smoothing anneal may be performed (e.g., at approximately 400° C.) (1206). A sacrificial oxide layer 509 is then grown to a thickness of approximately 1–3 nm on both the first and second semiconductor fins 101, 201 and specifically, on the top surface 115 and opposing sidewalls 116 of the first semiconductor fins 101. However, due to the ion 508 implanted at process 1204, the sacrificial oxide 509 grows at a faster rate on the top surface 115 of the first semiconductor fin 101 than it does on the opposing sidewalls 116 of the first semiconductor fin 101 and on the surfaces of the second semiconductor fin 201. The sacrificial oxide layer 509 is then stripped (e.g., using hydrofluoric acid, buffered hydrofluoric acid, or another similar selective etch) to remove irregularities (1208, see FIG. 16). However, this sacrificial oxide 509 is completely stripped only from the second semiconductor fin 201 and from the opposing sidewalls 116 of the first semiconductor fin 101. Because the sacrificial oxide layer 509 is thicker on the top surface 115 of the first semiconductor fin 101, a portion of the sacrificial oxide layer 509 will remain after the stripping process 1206. This remaining portion of the sacrificial oxide layer 509 provides the greater thickness of the first region 121 of the gate dielectric layer 120 on the top surface 115 of the first semiconductor fin 101. The second region 122 of the gate dielectric layer 120 of the first semiconductor fin 101 is then formed on the opposing sidewalls 116 of the first semiconductor fin 101 by either growing another oxide layer (e.g., by performing an oxidation and nitridation of the exposed silicon surfaces to form a nitrided silicon dioxide gate dielectric layer) or by depositing another dielectric layer (e.g., a high-k dielectric layer) (1212, see FIG. 17). This process 1212 also simultaneously forms the gate dielectric layer 220 for the second semiconductor fin 201.

Figure 3:
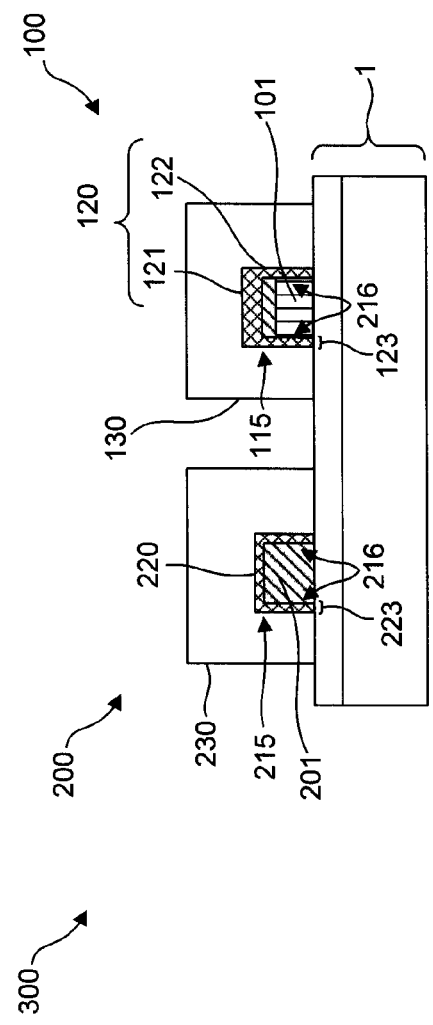
FIG. 3 is a schematic side-view cross-section of the embodiment of FIG. 2.
Figure 18:
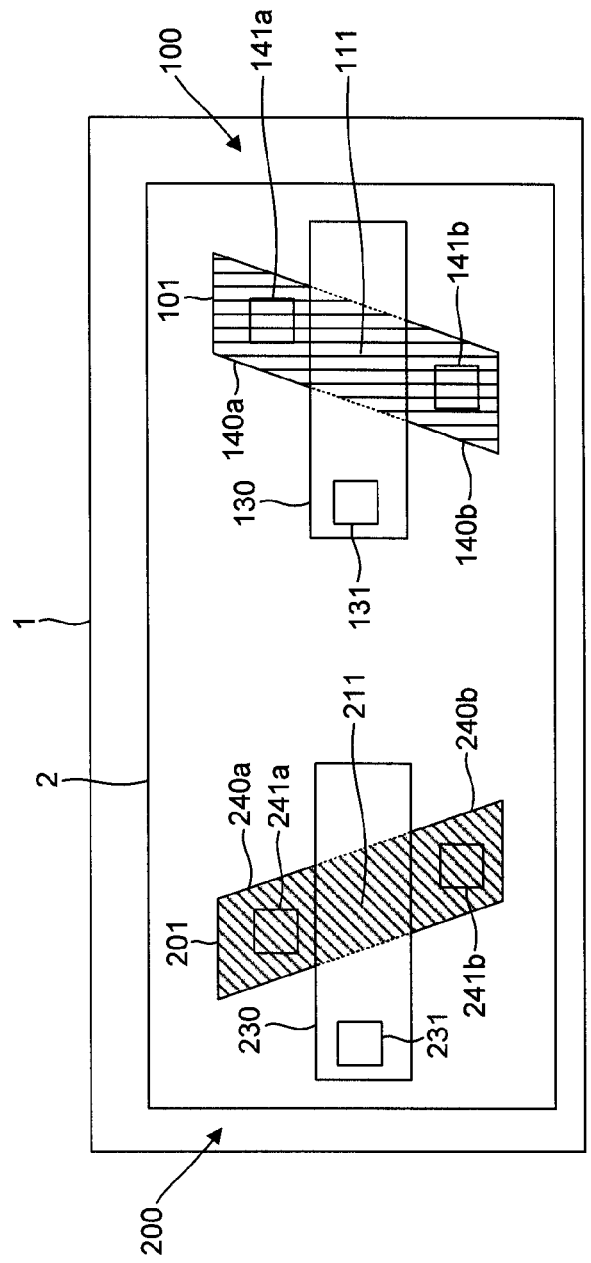
FIG. 18 is a schematic top-view illustration of the structure of the invention.

Once the gate dielectric layers 120, 220 are formed on the semiconductor fins 101, 201, the transistor formation process (416 of FIG. 4) can be completed for each of the different type tri-gate MOSFETs 100, 200. Referring to FIGS. 3 and 18 in combination, additional processing may include depositing, patterning and etching gate conductors 130, 230, forming source/drain extensions, forming halos, forming spacers, forming source/drain regions 140a–b, 240a–b, depositing and planarizing an additional dielectric layer 2, and forming gate contacts 131, 231 and source/drain contacts 141a–b, 241a–b.

Therefore, disclosed above is a structure with two different type tri-gate MOSFETs formed on the same substrate. Each MOSFET comprises a fin with optimal mobility for the particular type of MOSFET. However, due to the processes used to form fins with different crystalline orientations on the same substrate, one of the MOSFETs has a semiconductor fin with a higher mobility main body and a lower mobility top surface. To inhibit inversion of the lower mobility top surface this MOSFET further comprises a gate dielectric layer that has a thicker first region on the top surface than it does on the sidewalls. The thickness of this first region of the gate dielectric layer can be predetermined in order to selectively raise threshold voltage, to decrease capacitance, and to tune drive current, and thereby, to minimize delay of the tri-gate MOSFET. Additionally, several techniques for forming the thicker first region of the gate dielectric layer are also disclosed. One technique forms the thicker region of the gate dielectric layer with a hard mask used in forming the fin itself. Another technique forms the thicker region of the gate dielectric layer by implanting ions into the top surface of the fin so that when an oxide is grown on the fin, the oxide grows at a faster rate on the top surface. The advantages provided by this invention include use in digital applications to obtain decreased circuit delay for gate-dominated loads, lower power due to elimination of capacitance to the low-mobility surfaces, and decreased delay for wire-loaded circuits through selective use of thin gate dielectric on the low mobility surfaces. Additionally critical analog circuit applications and applications with ratio-sensitive digital circuits, such as latches, can be designed with improved performance, including increased noise margins, and decreased sensitivity to process variation.

While the invention has been described in terms of embodiments, those skilled in the art will recognize that the invention can be practiced with modification within the spirit and scope of the appended claims.

What is claimed is:
1. A field effect transistor comprising:
   a semiconductor fin having a top surface and opposing sidewall surfaces, wherein said opposing sidewall surfaces have a first crystalline orientation, wherein said top surface has a second crystalline orientation, and wherein said second crystalline orientation has a lesser mobility for said field effect transistor than said first crystalline orientation;
a gate dielectric layer comprising:
a first region with a first thickness on said top surface; and
second regions with a second thickness on said opposing sidewalls, wherein said first thickness is different from said second thickness and predetermined to inhibit inversion of said top surface; and
a tri-gate on said gate dielectric layer, wherein said tri-gate is adjacent to said top surface and said opposing sidewalls.

2. The field effect transistor of claim 1, wherein said first thickness is greater than said second thickness.

3. The field effect transistor of claim 1, wherein said first thickness is predetermined in order to selectively adjust one of a threshold voltage of said transistor and a drive current of said transistor.

4. The field effect transistor of claim 1, wherein a height of said semiconductor fin is approximately one-half to two times a width of said semiconductor fin.

5. A semiconductor structure comprising:
a substrate;
a first-type field effect transistor on said substrate, wherein said first-type field effect transistor comprises:
a first semiconductor fin having opposing sidewall surfaces with a first crystalline orientation and a top surface with a second crystalline orientation, wherein said second crystalline orientation has a lesser mobility for said first-type field effect transistor than said first crystalline orientation;
a gate dielectric layer comprising:
a first region with a first thickness on said top surface; and
a second region with a second thickness on said opposing sidewall surfaces, wherein said first thickness is different from said second thickness; and
a tri-gate on said gate dielectric layer, wherein said tri-gate is adjacent to said top surface and said opposing sidewalls; and
a second-type field effect transistor on said substrate, wherein said second-type field effect transistor comprises a second semiconductor fin with said second crystalline orientation.

6. The semiconductor structure of claim 5, wherein said first thickness is greater than said second thickness.

7. The semiconductor structure of claim 5, wherein said first thickness is predetermined in order to inhibit inversion of said top surface.

8. The semiconductor structure of claim 5, wherein said first thickness is predetermined in order to selectively adjust one of a threshold voltage of said first-type tri-gate field effect transistor and a drive current of said first-type tri-gate field effect transistor.

9. A semiconductor structure comprising:
a substrate;
a first-type field effect transistor on said substrate, wherein said first-type field effect transistor comprises:
a first semiconductor fin having first opposing sidewall surfaces with a first crystalline orientation and a first top surface with a second crystalline orientation, wherein said second crystalline orientation has a lesser mobility for said first-type field effect transistor than said first crystalline orientation; and
a first gate dielectric layer comprising:
a first region with a first thickness on said first top surface; and
a second region with a second thickness on said first opposing sidewall surfaces, wherein said first thickness is different from said second thickness; and
a second-type field effect transistor on said substrate, wherein said second-type field effect transistor comprises:
a second semiconductor fin with said second crystalline orientation; and
a second gate dielectric layer on said second semiconductor fin, wherein said second gate dielectric layer is approximately as thick as said second thickness and wherein said second thickness is predetermined in order to drive a large load capacitance.

10. The semiconductor structure of claim 9, wherein said first thickness is greater than said second thickness.

11. The semiconductor structure of claim 9, wherein said first thickness is predetermined in order to inhibit inversion of said first top surface.

12. The semiconductor structure of claim 9, wherein said first thickness is predetermined in order to at least one of selectively raise a threshold voltage, decrease a capacitance and tune a drive current.

13. A semiconductor structure comprising:
a substrate;
a first-type transistor on said substrate and comprising:
a first semiconductor fin having a first top surface and first opposing sidewall surfaces,
wherein said first opposing sidewall surfaces have a first crystalline orientation,
wherein said first top surface has a second crystalline orientation, and
wherein said second crystalline orientation has a lesser mobility for said first-type field effect transistor than said first crystalline orientation; and
a first gate dielectric layer comprising:
a first region with a first thickness on said first top surface; and
a second region with a second thickness on said opposing sidewall surfaces, wherein said first thickness is greater than said second thickness; and
a second-type field effect transistor on said substrate, wherein said second-type field effect transistor comprises:
a second semiconductor fin having a second top surface and second opposing sidewall surfaces both with said second crystalline orientation; and
a second gate dielectric layer with a same thickness on said second top surface and on said second opposing sidewalls, wherein said same thickness is approximately equal to said second thickness of said second region of said first gate dielectric layer on said first-type transistor.

14. The semiconductor structure of claim 13, wherein a height of said semiconductor fin is approximately one-half to two times a width of said semiconductor fin.

15. The semiconductor structure of claim 13, wherein said first thickness is greater than said second thickness.

16. The semiconductor structure of claim 13, wherein said first thickness is predetermined to inhibit inversion of said first top surface and to at least one of selectively raise a threshold voltage, decrease a capacitance and tune a drive current of said first-type transistor.

17. The semiconductor structure of claim 13, wherein said first region comprises an oxide material with a first thickness and a second region comprising one of an oxide material, a nitrided silicon dioxide material and a high-k dielectric material.

18. The semiconductor structure of claim 13, wherein said second-type field effect transistor has a non-orthogonal, non-parallel orientation on said substrate relative to said first-type field effect transistor.

* * * * *